United States Patent [19]
Cadet et al.

[11] Patent Number: 5,474,659
[45] Date of Patent: Dec. 12, 1995

[54] PROCESS AND APPARATUS FOR GENERATING PRECURSOR GASES USED IN THE MANUFACTURE OF SEMICONDUCTOR DEVICES

[75] Inventors: Gardy Cadet, Orange; James W. Mitchell, Somerset; Jorge L. Valdes, Bedminster, all of N.J.

[73] Assignee: AT&T Corp., Murray Hill, N.J.

[21] Appl. No.: 292,346

[22] Filed: Aug. 17, 1994

Related U.S. Application Data

[63] Continuation of Ser. No. 966,968, Oct. 26, 1992, abandoned, which is a continuation-in-part of Ser. No. 714,326, Jun. 11, 1991, abandoned, which is a continuation of Ser. No. 588,523, Sep. 18, 1990, abandoned, which is a continuation of Ser. No. 339,344, Apr. 18, 1989, abandoned.

[51] Int. Cl.$^6$ ................................................ C25B 1/00
[52] U.S. Cl. ........................ 204/101; 204/252; 437/104
[58] Field of Search ................................. 204/101, 252, 204/259; 437/104, 107, 132, 133

[56] References Cited

U.S. PATENT DOCUMENTS

| | | | |
|---|---|---|---|
| 3,404,076 | 10/1968 | Haycock | 204/101 |
| 4,178,224 | 12/1979 | Porter | 204/237 |
| 5,158,656 | 10/1992 | Ayers | 204/101 |

FOREIGN PATENT DOCUMENTS 1033576  8/1983  U.S.S.R. .

OTHER PUBLICATIONS

The BOCA$^R$ National Fire Prevention Code/1987 Building Officials and Code Administrations, Int. Inc. 7th Ed.. Country Club Hills, Ill. 60477.

P. D. Dapkus, *Ann. Rev. Mater. Sci.* 12, 243–269 (1982).
P. D. Dapkus, *Journal of Crystal Growth*, 68, 345–355 (1984).
R. H. Moss, *Journal of Crystal Growth*, 68, 78 (1984).
M. J. Ludowise, et al, *Journal of Electron. Mat.*, 10, 1051 (1981).
J. P. Duchenain, et al, *Journal of Crystal Growth*, 55, 64 (1981).
H. M. Manasenit, et al, *Journal of the Electrochemical Society*, 122, 444 (1971).
F. Goodridge, et al, "Porous Flow–through and Fluidized–Bed Electrodes", *Comprehensive Treatise of Electrochemistry*, 6, Chapter 6, p. 393 (1983).
P. W. Bridgman, *Journal of the American Chemical Society*, 36, 1344 (1914).
U.S. Patent Application Serial No. 07/39,344, filed Apr. 18, 1989.
U.S. Patent Application Serial No. 07/588,523, filed Sep. 18, 1990.
U.S. Patent Application Serial No. 07/714,326, filed Jun. 11, 1991.

*Primary Examiner*—John Niebling
*Assistant Examiner*—Brendan Mee
*Attorney, Agent, or Firm*—Bruce S. Schneider

[57] ABSTRACT

Many devices, such as those based on III–V semiconductor materials, are produced utilizing gases such as arsine that require careful handling of compressed gas cylinders. This care has engendered a search for alternate approaches. It has been found that the use of electrochemically generated gases such as arsine yields an efficient, pure source of such gases without necessitating the storage of large gas quantities. Thus, a device fabrication procedure including in situ electrochemical generation of gases such as arsine is particularly useful.

12 Claims, 3 Drawing Sheets

PROCESS AND APPARATUS FOR GENERATING PRECURSOR GASES USED IN THE MANUFACTURE OF SEMICONDUCTOR DEVICES

CROSS-REFERENCE TO RELATED APPLICATION

This application is a continuation of application Ser. No. 07/966968, filed on Oct. 26, 1992, now abandoned, which is a continuation-in-part application of Ser. No. 07/714,326, filed on Jun. 11, 1991, now abandoned which is a continuation of application Ser. No. 07/588,523, filed Sep. 18, 1990, now abandoned which in turn is a continuation of application Ser. No. 07/339,344, filed Apr. 18, 1989, now abandoned all of which are hereby incorporated by reference.

BACKGROUND OF THE INVENTION

This invention relates to the manufacture of devices and, in particular, the manufacture with gases of electronic devices.

ART BACKGROUND

The manufacture of many electronic and optical devices involves the formation of materials from gas precursors. For example, integrated circuits based on GaAs have just become commercially viable for specialty applications and rely on precursors such as arsine. Additionally, compound semiconductor materials, e.g., III–V materials such as gallium arsenide phosphide, indium gallium arsenide phosphide, indium gallium arsenide, indium arsenide, indium aluminum arsenide phosphide, gallium aluminum arsenide, and gallium arsenide antimonide, formed from precursors such as arsine, phosphine and stibine, are widely used in the fabrication of solid state lasers, light emitting diodes, field effect transistors, and photodetectors.

A variety of gas phase fabrication procedures such as metal organic chemical vapor deposition (MOCVD), hydride vapor phase epitaxy (VPE), molecular beam epitaxy (MBE), and gas source MBE are available. In these procedures, precursor gases are utilized that interact with other precursor gases and/or with an energy source, i.e., heat, photons, plasmas, electrons, to yield formation of the desired material. Many common precursor gases such as arsine are quite toxic or present other handling considerations. (See The BOCA® National Fire Prevention Code/ 1987 Building Officials and Code Administrations, Int. Inc. 7th Ed. Country Club Hills, Ill. 60477, for a review of a variety of procedures utilizing precursors such as arsine in the fabrication of devices.) Although perfectly adequate devices have been made, the precursor is typically supplied from a compressed gas cylinder. For gases having properties such as high toxicity, the catastrophic failure of a compressed gas cylinder or lines leading directly from such cylinder is undesirable.

Few approaches to reduce possible problems associated with storage of large quantities of gases in device fabrication are available. In one approach, arsine is generated through the catalytic interaction of copper arsenide and phosphoric acid. The reactants are controlled so that the arsine generated is limited to the quantity necessary for immediate use in device fabrication. These processes produce arsine at a relatively low rate. Typically, arsine pressures less than 150 Torr are generated. Additionally, the subsequent disposal of the catalytic material and byproducts poses a significant problem. Thus, totally acceptable approaches for device fabrication utilizing a source of gas, other than a compressed gas source, are not presently available.

SUMMARY OF THE INVENTION

Electronic and/or optical devices are produced in a process which directly supplies gases such as arsine, stibine, phosphine and germane by electrochemical in situ generation. Through the choice of appropriate electrolyte and electrodes the gas is generated at a very high efficiency (up to 97%), very little impurity is produced, and the electrolyte when spent is relatively innocuous, e.g., essentially only sodium hydroxide aqueous solution. Pressures of 20 psig or greater are easily generated and flow rates are expeditiously controlled to yield uniform delivery in the device fabrication process.

An exemplary device fabrication method involves the use of an electrochemical cell including a packed bed arsenic cathode surrounded by a barrier to anions, a counterelectrode such as a molybdenum or tungsten anode, and an aqueous sodium hydroxide electrolyte. By applying current densities on the order of 20 $mA/cm^2$ or greater to the electrode, arsine gas pressures of 20 psig or greater are easily developed. Essentially, no impurities are present except water vapor. The water vapor is expeditiously removed by treating the material with a molecular sieve. A small amount of hydrogen (up to 3%) is generated, but as in many fabrication procedures, hydrogen is used as a carder gas for the arsine and thus needs no removal.

DETAILED DESCRIPTION

Figure 1:
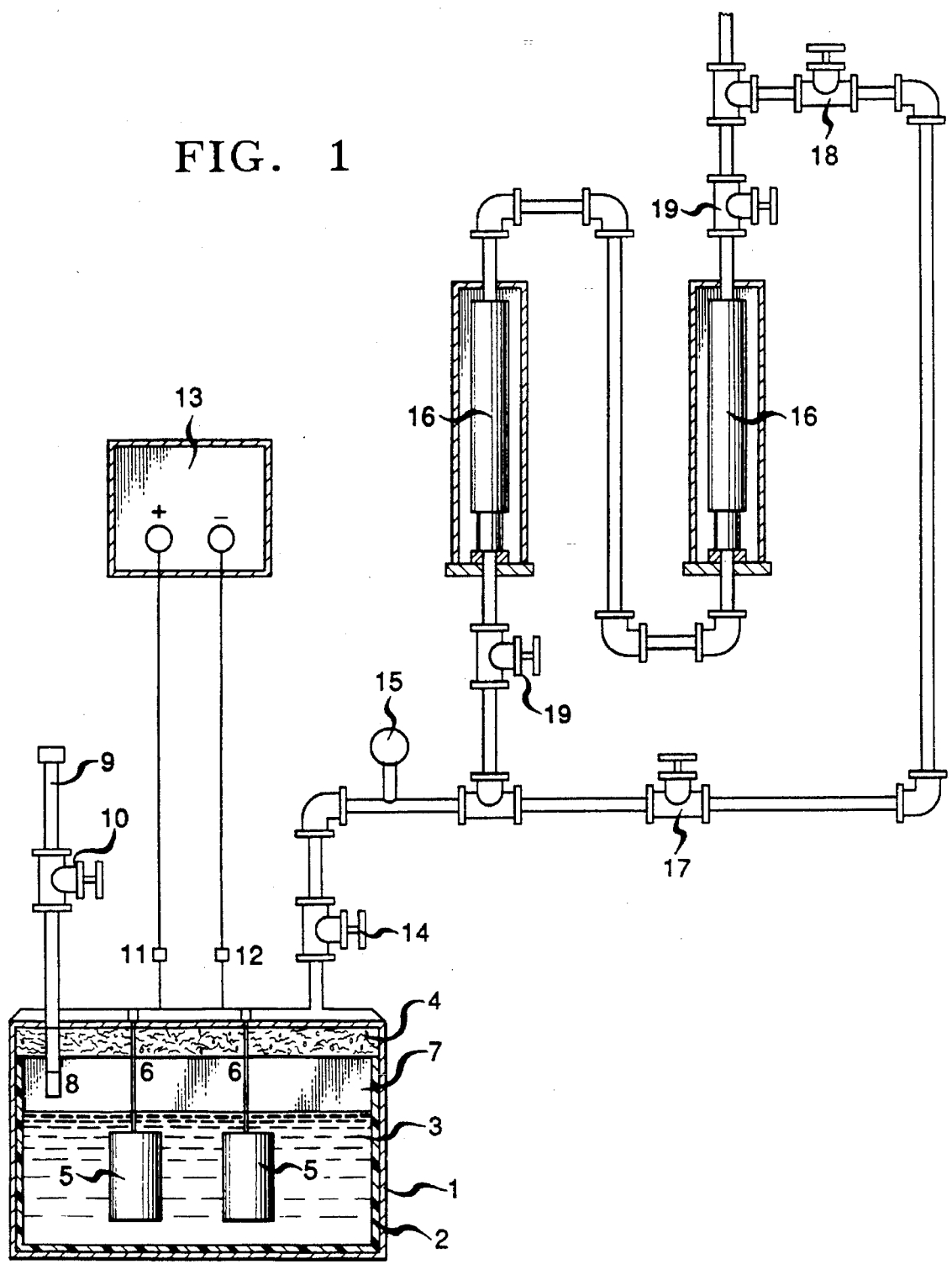
FIG. 1 is illustrative of an apparatus useful in practicing the invention.

The applicants have found that by using an electrochemical precursor gas generation process in a device fabrication sequence quite advantageous results are achieved. The electrochemical process is utilized to generate a gas that is then, in turn, utilized to form a material in the device structure. Device fabrication procedures such as described in, *Ann. Rev. Mater. Sci.*, 12, 243–269 (1982) and *Journal of Crystal Growth*, 68, 345–355 (1984), are well known and are hereby incorporated by reference. For example, device fabrication techniques using arsine are described in R. H. Moss, *Journal of Crystal Growth*, 68, 78 (1984), M.J. Ludowise, C. B. Cooper III, and R. R. Saxena, *Journal of Electron. Mat.*, 10, 1051 (1981), J.P. Duchenain, J.P. Hirtz, M. Razeghi, M. Bonnet, and S. D. Hersee, *Journal of Crystal Growth*, 55, 64 (1981), while device preparation techniques utilizing germane are disclosed in H. M. Manasenit, W. I. Simpson, *Journal of the Electrochemical Society*, 122, 444 (1971). These techniques are used in conjunction with at least one gas generated by electrochemical interaction that is directly employed in the fabrication procedure so that substantially no storage of this precursor gas is required, i.e., during the fabrication process less than 0.1 moles of at least one of the generated gases is present in the fabrication apparatus, including the gas generator, at any time.

The particular electrochemical cell utilized depends upon the specific gas to be generated. It has been found, however, in general that through appropriate choice of electrochemical conditions, pure precursor gases are produced at sufficiently high pressures, quantities and purity so that they are easily used in device fabrication techniques. The electrochemical cell includes an anode, a cathode, and an electrically conductive electrolyte in which the electrodes are at least partially immersed. Typically, cathodic reactions are utilized to produce the precursor gases. Thus, for example, a solid arsenic or preferably a packed bed cathode is utilized for generation of arsine while corresponding antimony, germanium, or black phosphorus electrodes are utilized respectively for the generation of stibine, germane, and phosphine. (Black phosphorus is synthesized as described by P. W. Bridgman, in *Journal of the American Chemical Society*, 36, 1344 (1914)). For cathodic precursor generation, the composition of the anode is not critical. However, if oxygen is an undesirable impurity for the particular device fabrication sequence to be utilized (such as the use of arsine in electronic device manufacture), then inert electrodes such as platinum electrodes should not be employed.

In one embodiment, the cathode and anode are formed from the same material. This symmetry of electrodes has advantages. It is possible to periodically change the current polarity to convert the anode into the cathode. In this manner, uniform use of both electrodes is ensured. Additionally, material, e.g., arsenic, consumed at the cathode is, in substantial part, replaced by the introduction of soluble entities from the anode into the electrolyte that migrate to the cathode and are converted to elemental material. Thus, for example, in the case of arsenic electrodes and a sodium hydroxide aqueous electrolyte, arsenic is converted into $AsO_2$—which is soluble to the aqueous electrolyte. This negative ion is transported to the cathode where it is electrochemically converted to arsenic for cathode replenishment.

In a second embodiment, the anode is formed from molybdenum, tungsten, or alloys of these materials. (An alloy of this material is a metal containing at least 50 weight percent molybdenum or tungsten.) Both molybdenum and tungsten are particularly advantageous, because they are electrical conducting, extremely soluble in the electrolyte, and because any ions introduced into the electrolyte from the anode do not interfere with the desired electrochemical reaction at the cathode. However, a suitable anion barrier expedient is employed at the cathode to further ensure that anodic oxidation byproducts do not interfere with the production of arsine at the cathode. Generally, the design of the anode is affected in part by the geometry of the cathode. However, a plate that is parallel to the active surface of the cathode is useful. Plates of tungsten, molybdenum, or their alloys are easily formed by commercial metallurgical casting techniques. Some scaling from the anode occurs with tungsten and molybdenum, but this scaling has not been found to undesirably interact with the cathode reaction especially when a suitable anion barrier expedient is employed at the cathode.

Although solid cathode electrodes such as solid arsenic electrodes are useful, more cost effective generation of precursor gas is produced by utilizing expedients such as packed bed electrodes. (See F. Goodridge and A. R. Wright, "Porous Flow-through and Fluidized-Bed Electrodes", in *Comprehensive Treatise of Electrochemistry*, Vol. 6 Chapter 6, p. 393, (1983), Plenum Press, N.Y., for a general description of packed bed electrodes.) The electrodes are produced by conventional techniques. For example, solid electrodes of arsenic, black phosphorus, or germanium, are produced by the compression of particles.

Figure 3:
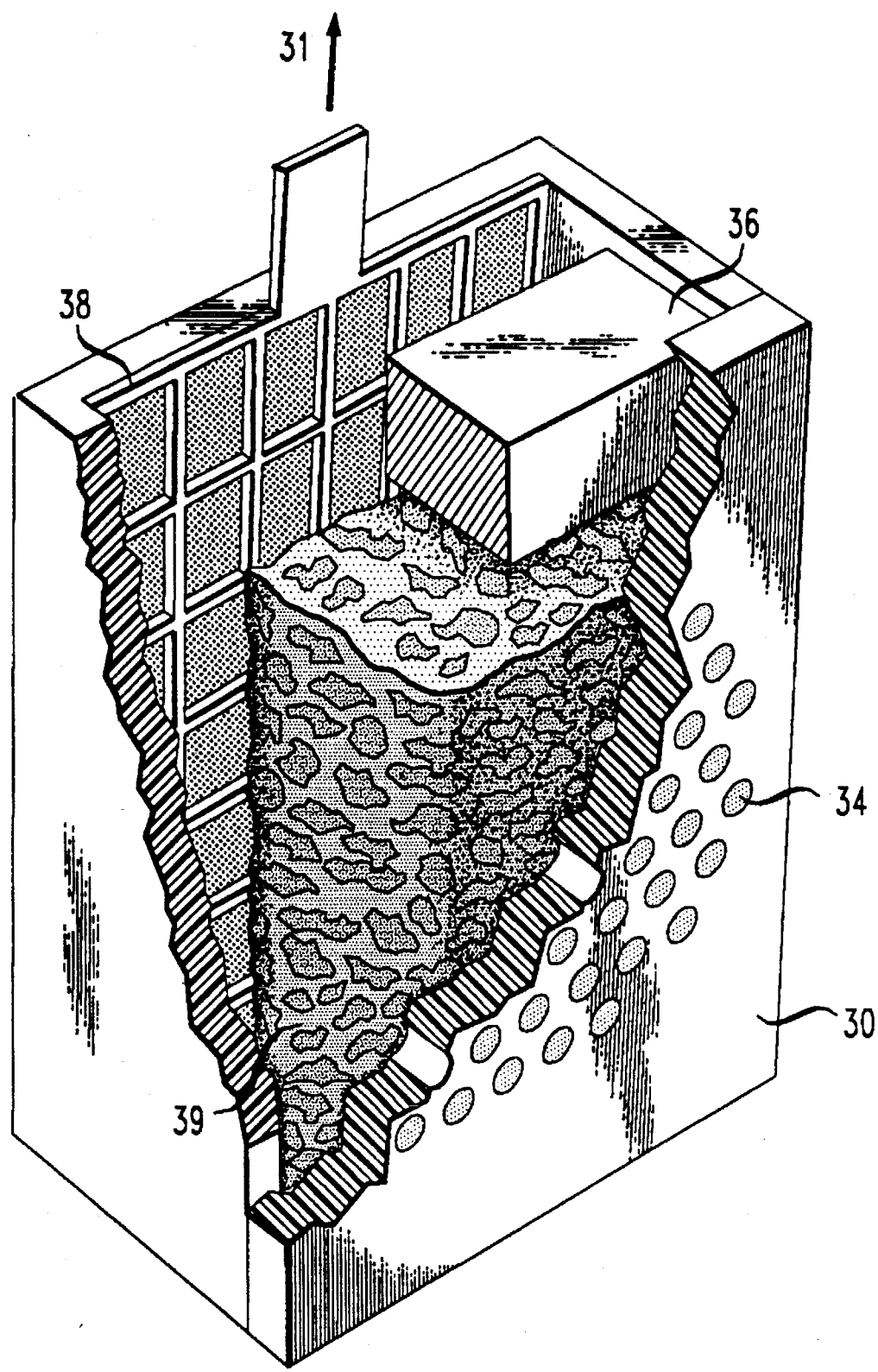

A particularly effective cathode is formed in a packed bed configuration. This cathode, as shown in FIG. 3, involves a containing vessel such as a box, 30, formed from a material (e.g., poly(fluorocarbon)), that does not react with the electrolyte. This box is filled with granuales, 39, of the cathode material, e.g., arsenic, black phosphorus, antimony, or germanium. A weight, 36, is advantageously employed to compress the material packed into the cathode bed. (Suitable weights are produced using molybdenum or lead coated with an insulating polymer such as a poly(fluorocarbon) to prevent interaction with the electrolyte and electrical contact with the cathode.) The electrical contact plate, 38, is advantageously formed from a grid of a material such as zirconium, lead, hafnium, or titanium carbide (TiC). Although other conductive materials are useful, the use of these materials is particularly advantageous since these materials do not, induce plating of their anodic corrosion byproducts on the active cathode composition and do not lead to any significant hydrogen generation. Electrical contact to this feeder plate is made by conventional techniques such as the use of a projecting portion, 31. The side of the vessel opposite the contact plate has openings, 34, to funnel current and electrolyte through the bed in the direction of the anode, 41. The spacing and size of these openings is not critical and typically, a random pattern of holes is employed.

Figure 4:
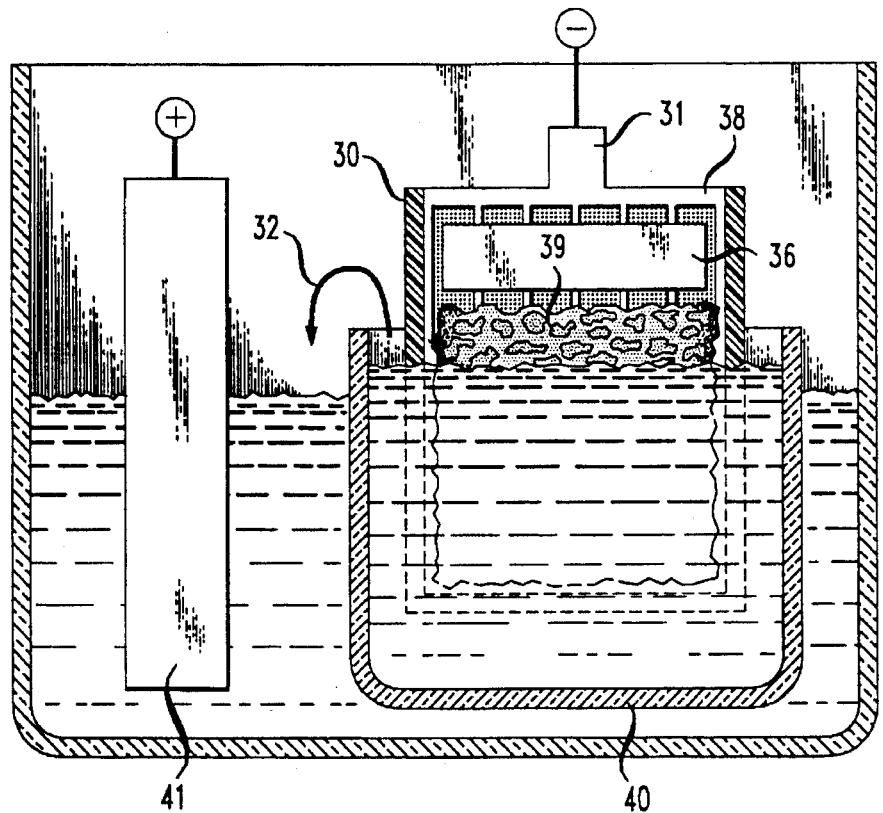

As previously discussed, a suitable expedient is advantageous to prevent ions such as molybdenum or tungsten containing ions generated in the anode region from interacting at the cathode. In particular, ions such as $MoO_4^{-2}$ and $WO_4^{-2}$ have a tendency to be reduced at the cathode and form corresponding electrically insulating materials. Clearly, formation of insulating materials on the arsenic or electrical contacts of the cathode are not desirable. To prevent migration of such ions to the cathode, a suitable membrane is employed. Membranes such as NAFION®#324 and #417 (perfluorinated cation exchange polymers) are formed in a container that fits around a cathode as shown at 40 in FIG. 4. Generally, such membranes are foraged into a bag-like structure slightly larger than the cathode enclosure. Generally, since ions carrying current such as electrolyte ions of potassium pass through these membranes with associated water molecules, the water level tends to rise in the cathode regions relative to the anode region. To compensate for this rise, an overflow is provided at 32 to allow water to return to the anode region. However, flow of electrolyte in the opposite direction (from anode to cathode compartments) that avoids the membrane is undesirable and in the configuration of FIG. 4 is avoided.

Although two electrodes are sufficient for gas generation, the invention is not so limited. Configurations having multiple electrodes, e.g., a plurality of cathodes and anodes, are acceptable. Although the geometry of the electrode is not critical, it is typically desirable to use a geometry that leads to a relatively uniform current density throughout the electrode. If the current density is particularly nonuniform, portions of the electrode are preferentially consumed leading to shortened electrode life. Generally, the electrode should have a shape such that during operation no voids penetrate from a surface into the bulk a distance of more than 20% preferably more than 10%. Configurations such as two parallel plate electrodes, a cylindrical anode electrode surrounding a cylindrical arsenic packed cathode, or a packed bed cathode with a plate anode are generally acceptable.

Generally, it is desirable to use an aqueous electrolyte to simplify reaction conditions and to substantially reduce the inconvenience associated with disposal of the electrolyte. To avoid production of impurities, it is typically desirable to use an aqueous electrolyte based on hydroxide mobile species. Thus, solutions including the alkali and alkaline-earth hydroxides are advantageously employed.

Generally, to avoid production of oxygen and to produce highly soluble anodic products with electrodes such as arsenic electrodes where such production is unacceptable for the device fabrication sequence, a basic electrolyte should be employed. Typically, aqueous hydroxide electrolytes having a concentration between 0.1 M and 19 M are advantageously employed. Concentrations greater than 19 M lead to some difficulty in handling and concentrations less than 0.1 M, although not precluded, lead to decreased efficiency of gas generation. Through the use of a hydroxide electrolyte, the ratio or precursor gas to hydrogen generation is high. For example, in the generation of arsine through the use of an arsenic electrode and an aqueous hydroxide electrolyte, generation efficiencies of approximately 97% arsine relative to hydrogen are achieved.

Typically, in the operation of the electrochemical cell, material from the electrode reaches a steady state concentration in the electrolyte. In some cases, before disposal of the electrolyte, it is desirable to remove this material. For example, in the case of arsine generation, $AsO_2$—entities are present in the electrolyte. Typically, the levels of this solublized material are relatively low, e.g., around less than 0.5%. Nevertheless, if desired, the material is removable through deposition of arsenic from the electrolyte onto the cathode by applying a relatively small current density, i.e., current density in the range 1–2 $mA/cm^2$, between the cathode and an inert anode. Alternatively, chemical oxidation to $As_2O_3$, or exchange of the $AsO_2^-$ on a resin is useful for removal.

As previously discussed, the current density per unit surface area of reactive material in the electrode determines the rate at which the precursor gas is generated. Typically, reactive surface areas in the range 0.5 to 100 square inches) are desirable. Surface areas greater than 100 square inches, although not precluded, are typically harder to produce while surface areas less than 0.5 square inches, although not precluded, are undesirable due to limited electrode lifetime. Additionally, current densities greater than 1 $A/cm^2$ are generally unacceptable since they tend to induce sparks that could ignite any combustible gas present, e.g., hydrogen. Current densities less than 2 $mA/cm^2$, although not precluded, generally degrade gas generation efficiency.

For typical current densities a water mist is produced by the generated gas bubbling through the electrolyte and by heating of the electrolyte. It is desirable to suppress this mist generation, especially in device fabrication techniques sensitive to water, by using conventional expedients such as a mist suppressor. Commercial suppressors are available and are constructed from inert materials or stainless steel.

Typically, the reaction vessel is made sufficiently strong to endure the pressures required for the device fabrication sequence. Typically, pressures in the range 3 Torr to 30 psig are utilized for device fabrication. In particular, if mass gas flow controllers are utilized, pressures of about 20 psig or greater are required to ensure accurate functioning of the control. Generally, for fabrication gas pressures in the range 10 to 20 psig, the vessel should be capable of enduring pressures in the range 100 to 300 psig.

The generated precursor gas is either used directly for device fabrication or is diluted with another gaseous material. For example, it is possible to introduce carrier gases such as hydrogen or inert carder gases such as helium or argon. It is possible to introduce the precursor gas into the carder downstream from the electrochemical generator or introduce the carrier gas into the electrochemical generator with subsequent flow of the mixture of carrier and the precursor gas from the generator.

The following examples are illustrative of the conditions useful in the practice of the invention.

Example 1

The electrochemical cell unit, 1, was constructed from a stainless steel cell and inner-lined with Teflon®, 2, for chemical inertness. Two ports were provided-an inlet port, 9, for gas purging of the cell with either hydrogen, argon, or helium and an outlet, 14, for the gases generated within the electrochemical unit. The cell unit had two electrical feedthroughs, 6, providing electrical contacts to the arsenic electrodes, 5, within the cell. A mist eliminator, 4, constructed from an inert material was included inside the electrochemical unit as depicted in FIG. 1 to reduce the aerosol water content in the generated gases exiting through the outlet port. A constant current power supply, 13, was used to provide a constant current to the cell. The positive pole on the power supply, 11, was connected to the arsenic anode electrode and the negative pole, 12, was connected to the arsenic cathode electrode. The exit port, 14, on the cell was connected in series to two commercially available molecular sieve cannisters, 16. The molecular sieves in this configuration reduced the water vapor content of the gases generated to less than 80 parts per billion by volume.

Arsine was electrochemically generated from an electrolyte, 3, of 1 M NaOH (semiconductor grade, 99.99%) prepared with 18 MΩ—cm resistivity ultrapure Milli-Q water. The arsenic electrodes were made from high purity arsenic pieces (Aldrich, 99.9999%). Electrodes were fabricated by attaching an arsenic piece to one end of a 5-inch stainless steel rod with conductive silver epoxy paint. The end piece was cast inside a mold with organic resin epoxy producing an arsenic electrode. The steel rod was insulated with an epoxy sleeve and provided electrical contact to the arsenic electrode in the cell.

Based on the laboratory-design cell described previously and depicted in FIG. 1, a prototype electrochemical cell was designed and is shown in FIG. 4. The features of this cell include packed-bed electrode, anode materials constructed of molybdenum or tungsten, 41, and a cation exchange NAFION® membrane, 40, that prevents soluble anions produced during the oxidation of the anode from chemical interactions and physisorption on the cathodic bed material. For this process, it is also advantageous to set the initial anolyte hydroxide concentration higher than the hydroxide concentration in the catholyte to account for the net depletion of hydroxide species in the anode compartment and the production of excess hydroxide species within the packed-bed cathode compartment. Operation of the electrochemical cell between 10–20 amps of DC current was found to yield suitable rates of arsine generation for commercial applications.

Figure 2:
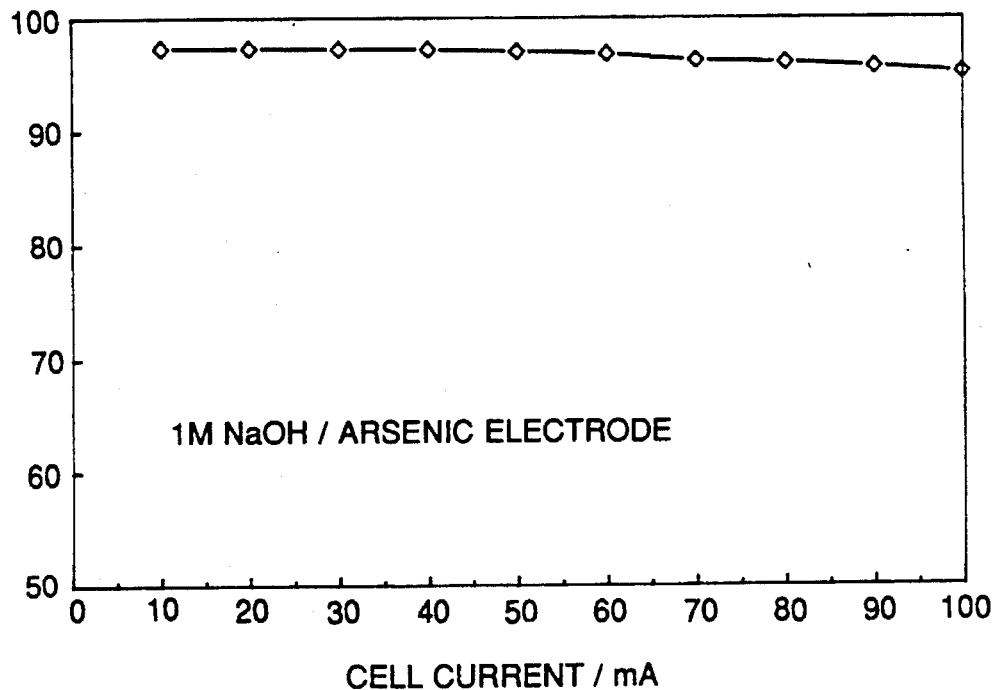
FIG. 2 is illustrative of efficiencies attainable in the generation of gases such as arsine and FIGS. 3 and 4 are illustrative of electrochemical configurations useful in practicing the invention.

Arsine generation was performed under galvanostatic (constant current) conditions by applying a given external current between the arsenic cathode electrode and the arsenic anode electrode. Constant current was supplied by a Harrison 6181A DC power supply and measured with a Kiethley 179 TRMS digital meter in series with the electrochemical cell. Prior to arsine generation, the electrochemical cell was purged with nitrogen gas at a flow rate of 200 standard cubic centimeters per minute through inlet 9 and valve 10 using bypass valves 17 and 18. Valve 10 was closed and the electrochemical cell was pumped down to a total system pressure of approximately 0.2 Torr, as monitored by a 10 Torr high precision MKS Barotron, 15. This procedure allowed on-line analysis of the gases generated within the electrochemical cell with a UTI mass spectrometer. The pumping was terminated, valves 17 and 18 were closed and valve 19 was opened. Current was applied at a level commensurate with the desired generation rate of arsine. The electrochemical cell was operated at pressures up to 30 psig or more for the generation of arsine. The current efficiency for arsine generation in the electrochemical cell is shown in FIG. 2 as a function of the applied cell current in units of milliamps. The current efficiency was found to be approximately 97% and was essentially constant with applied current.

We claim:

1. A process for fabricating a device including a material region, said process comprising the steps of supplying a quantity of previously generated precursor gas and employing said gas towards the completion of said device characterized in that said gas is generated in an electrochemical cell and such that substantial storage of said gas and substantial generation of oxygen is avoided, where said cell comprises a basic electrolyte, molybdenum or tungsten anode, an arsenic packed-bed cathode, and a barrier to prevent anions produced during the anodic oxidation of molybdenum or tungsten from contacting the cathode.

2. The process of claim 1 wherein said precursor gas comprises arsine.

3. The process of claim 2 wherein said device includes a region of gallium arsenide.

4. The process of claim 1 wherein said device comprises an integrated circuit.

5. The process of claim 1 wherein said electrolyte is between 0.1 and 19 M in hydroxide species.

6. The process of claim 1 wherein said material region comprises a III–V semiconductor material.

7. The process of claim 6 wherein said III–V semiconductor material comprises GaAs.

8. The process of claim 1 wherein said basic electrolyte comprises an aqueous solution.

9. A process for fabricating a device including a material region, said process comprising the steps of supplying a quantity of previously generated precursor gas and employing said gas towards the completion of said device characterized in that said gas is generated in an electrochemical cell and such that substantial storage of said gas and substantial generation of oxygen is avoided, where said cell comprises a basic electrolyte, molybdenum or tungsten anode, a germanium packed-bed cathode, and a barrier to prevent anions produced during the anodic oxidation of molybdenum or tungsten from contacting the cathode.

10. A process for fabricating a device including a material region, said process comprising the steps of supplying a quantity of previously generated precursor gas and employing said gas towards the completion of said device characterized in that said gas is generated in an electrochemical cell and such that substantial storage of said gas and substantial generation of oxygen is avoided, where said cell comprises a basic electrolyte, molybdenum or tungsten anode, an antimony packed-bed cathode, and a barrier to prevent anions produced during the anodic oxidation of molybdenum or tungsten from contacting the cathode.

11. An electrochemical cell for the generation of precursor gases, said cell comprising a basic electrolyte, a molybdenum or tungsten anode, an arsenic packed-bed cathode, and a barrier to prevent anions produced during the anodic oxidation of molybdenum or tungsten from contacting the cathode wherein substantial generation of oxygen during operation of said cell is avoided.

12. The electrochemical cell of claim 11 wherein said electrolyte is between 0.1 and 19 M in hydroxide.

* * * * *